(12) United States Patent
Yamaguchi et al.

(10) Patent No.: US 7,348,723 B2
(45) Date of Patent: Mar. 25, 2008

(54) EMISSION DEVICE, SURFACE LIGHT SOURCE DEVICE, DISPLAY AND LIGHT FLUX CONTROL MEMBER

(75) Inventors: Masao Yamaguchi, Kitamoto (JP); Shingo Ohkawa, Misato (JP)

(73) Assignee: Enplas Corporation, Kawaguchi (JP)

( * ) Notice: Subject to any disclaimer, the term of this patent is extended or adjusted under 35 U.S.C. 154(b) by 15 days.

(21) Appl. No.: 11/235,361

(22) Filed: Sep. 27, 2005

(65) Prior Publication Data

US 2006/0066218 A1    Mar. 30, 2006

(30) Foreign Application Priority Data

Sep. 27, 2004   (JP)   ............................. 2004-278888

(51) Int. Cl.
*H01J 1/62* (2006.01)
*F21V 3/04* (2006.01)

(52) U.S. Cl. ..................... 313/501; 313/512; 362/311; 362/335

(58) Field of Classification Search ................ 313/498, 313/501, 512; 362/311, 331, 307–309, 335–338, 362/340, 222, 223, 326, 257
See application file for complete search history.

(56) References Cited

U.S. PATENT DOCUMENTS 4,609,978 A * 9/1986 Hsieh et al. ................ 362/335

6,850,001 B2 * 2/2005 Takekuma ................... 313/501
2005/0093430 A1 * 5/2005 Ibbetson et al. ............ 313/501

FOREIGN PATENT DOCUMENTS

| JP | 59-226381 | 12/1984 |
|----|-----------|---------|
| JP | 63-6702 | 1/1988 |
| JP | 2002-49326 | 2/2002 |

* cited by examiner

*Primary Examiner*—Sandra O'Shea
*Assistant Examiner*—Bao Q. Truong
(74) *Attorney, Agent, or Firm*—Staas & Halsey LLP

(57) ABSTRACT

A display has a member irradiated by a surface light source device comprising a light diffusion member and emission device. The emission device is provided with a light flux control member having a recess and light control emission face which is configurated so as to satisfy Conditions 1 and 2 in a range at least covering a half-intensity-angular-range. Light emitting element(s) may be sealed. Condition 1 is that relation $\theta 5/\theta 1>1$ is satisfied except for light emitted from a light emitting element toward within an angular-neighbourhood of a standard optical axis of the emission device, and Condition 2 is that value of $\theta 5/\theta 1$ decreases gradually according to increasing of $\theta 1$, where $\theta 1$ is an emission angle of any light at being emitted from the light emitting element, and $\theta 5$ is an emission angle of that light of $\theta 1$ at then being emitted from the light control emission face of the light flux control member.

18 Claims, 13 Drawing Sheets

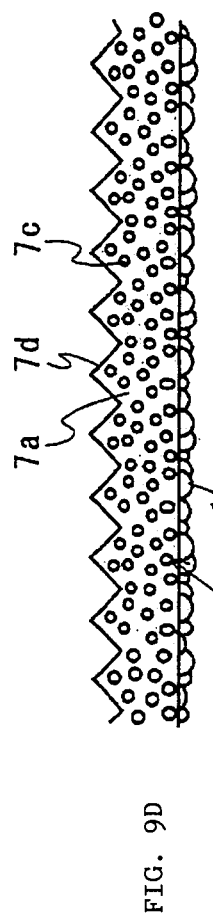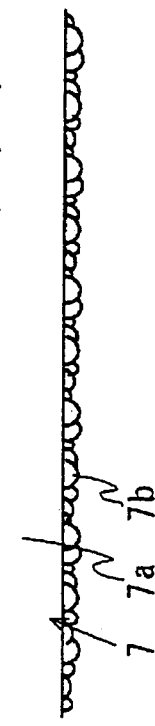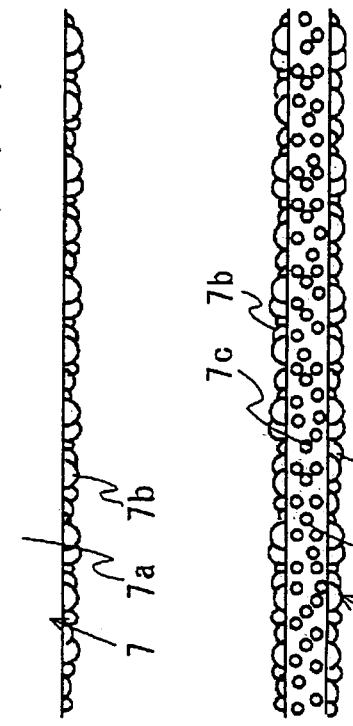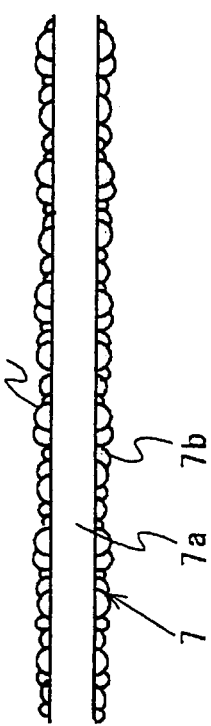
FIG. 9D  FIG. 9C  FIG. 9B  FIG. 9A
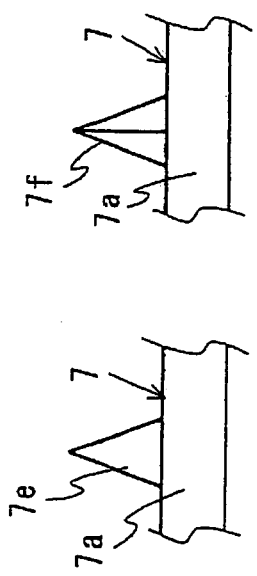
FIG. 9F  FIG. 9E
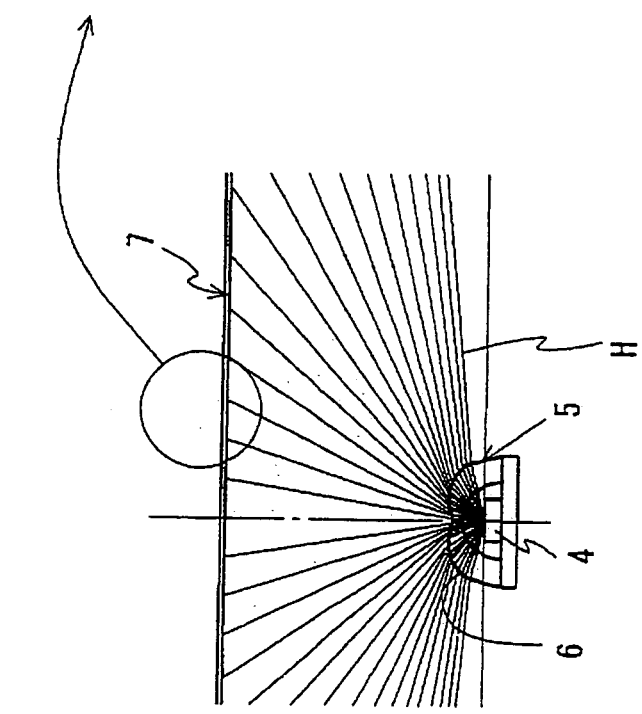
FIG. 9G

EMISSION DEVICE, SURFACE LIGHT SOURCE DEVICE, DISPLAY AND LIGHT FLUX CONTROL MEMBER

BACKGROUND

1. Field of Invention

The present invention relates to an emission device, surface light source device, display, and light flux control member used therein. The present invention is applied, for instance, to backlighting arrangements for liquid crystal display panel, various illumination devices for general uses such as interior illumination, or displays composed of illumination device and member to be irradiated.

2. Related Art

A surface light source device employing a plurality of LEDs (light emitting diodes) as point-like light sources has been known as an illuminating means for a LCD monitor display of a personal computer or TV set. A plate-like light flux control member having roughly the same shape as that of a LCD panel is employed in the surface light source device, being provided with a plurality of LEDs arranged like a matrix at the back side. The LEDs emit light which is incident to a back face of the light flux control member and travels within the light flux control member to an emission face opposite to the back face, being outputted from the emission face toward a LCD panel to be backlighted. Prior arts like this have been disclosed in the following documents.

<Prior Art 1>

This is found disclosed in Tokkai 2002-49326 (JP-A 2002-49326), according to which surface light source device 10 is provided with microlens array 102. Individual microlenses are arranged in one-to-one correspondence to a plurality of LEDs 101, as shown in FIG. 12. Light from LEDs 101 is outputted in a direction perpendicular to a plane (upward) via microlens array 102.

<Prior Art 2>

This is found disclosed in Tokkaisho 59-226381(JP-A 1984-226381), according to which emission display device 103 is provided with LED 104, concave lens 105 and convex lens 106, as shown in FIG. 13. Light from LED 104 is condensed by convex lens 106 after being diverged by concave lens 105, being outputted in a direction roughly parallel with an "optical axis" of LED 104. Please note that "optical axis" is defined as a light travelling direction at a center of three-dimensional light flux emitted from a point-like light source (LED 104).

<Prior Art 3>

This is found disclosed in Tokkaisho 63-6702 (JP-A 1988-6702), providing display 107 having LED(s) 108, as shown in FIG. 14. Light from LED 108 is condensed by condenser lens 110 and directed forward, then being diverged by diverging lens 111.

<Prior Art 4>

Another prior art provides display 121 as shown in FIG. 15. Display 121 is provided with a plurality of LED chips 125, light diffusion member 126 and member 127 (such as LCD panel) irradiated by light transmitted through light diffusion member 126. LED chips 125, each of which is composed of LED 124 and light flux control member 123 fixed on an emission surface side, are arranged at intervals, for instance, at regular intervals. Light flux control member 123 has hemisphere-like emission surface 122. Object 127 is supplied with light emitted from LED chips 125 and then transmitted through light diffusion member 126.

However, the above prior arts involve problems as follows.

(1) Prior Art 1;

Surface light source device 100 has a portion at which configuration of microlens array 102 varies discontinuously. The portion is located between LEDs 101 adjacent to each other. Emission intensity changes sharply at this discontinuity portion, with the result that a conspicuous unevenness in brightness appears around boundary regions between individual microlenses of microlens array 102.

(2) Prior Art 2;

It is difficult to say that concave lenses 105 in emission display 103 are coupled with each other continuously to form a plane. Further to this, convex lenses 106 are scarcely coupled with each other continuously to form a plane. Therefore, a member of a large area to be illuminated, such as large-screen liquid crystal display panel, is hardly supplied with uniform illumination light.

(3) Prior Art 3;

With display 107, light from LED 108 is diverged by diverging lens 111 after being condensed by condenser lens 110. This wil reduce unevenness in brightness as compared with Prior Art 1. However, a sufficient mixing of light fluxes from LEDs 108 adjacent to each other is hardly expected, with the result that unevenness in emission color between individual LEDs 108 tends to be conspicuous.

(4) Prior Art 4;

With display 121, wave-shaped brightness unevenness appears strikingly corresponding to LEDs 124 arranged at intervals, as shown in FIG. 10. This brings dark areas corresponding to absence of LED 124 between LED s 124, making uniform illumination difficult. In addition, Prior Art 4 tends to give a locally large brightness area in the vicinity of optical axis L of LED 125. Therefore, it is difficult to male light from LEDs 124 adjacent to each other mixed well, with the result that unevenness in emission color between individual LEDs 124 tends to be conspicuous.

OBJECT AND SUMMARY OF INVENTION

An object of the present invention is to enables an emission device, surface light source device employing the emission device, and display employing the surface light source device to provide uniform area illumination free from conspicuous brightness unevenness.

Another object of the present invention is to enable the above devices, if they employ single point-like light source such as LED, to expand light from the point-like light source smoothly and effectively to a desirable range.

A still another object of the present invention is to avoid a surface light source device employing a plurality of point-like light sources such as LEDs, and display employing the surface light source device from showing a conspicuous unevenness of emission color.

Another object of the present invention

A further object of the present invention is to provide a light flux control member employable in the above devices.

In the first place, the present invention is applied to an emission device comprising a light flux control member provided with a recess and an light control emission face, and a light emitting element accommodated in said recess, wherein the light emitting element emits light which is emitted from the light control emission face after travelling within said light flux control member.

According to a feature of the present invention, said light control emission face is configured so as to satisfy the following Conditions 1 and 2 for at least light which is emitted toward within a half-intensity-angular-range around a maximum-intensity-emission-direction from said light emitting element.

Condition 1: Relation $\theta 5/\theta 1>1$ is satisfied except for light emitted toward within an angular-neighborhood of a standard optical axis of said emission device;

Condition 2: Value of $\theta 5/\theta 1$ decreases gradually according to increasing of $\theta 1$;

where $\theta 1$ is an emission angle of any light at being emitted from said light emitting element, and $\theta 5$ is an emission angle of that light of $\theta 1$ at then being emitted from said light control emission face of said light flux control member.

Please note that the above angular-neighborhood of the standard optical axis of the emission device, in other words, an angular-neighborhood of optical axis L shown in FIG. 3, preferably corresponds to within a range of $\theta 1$ from about $-5°$ to about $+5°$.

The light control emission face provides a concave surface which may be in contact with an light emitting surface of the light emitting element. Alternatively, a gap may be formed between the concave surface and the light emitting surface of the light emitting element.

The light control emission face may include a first emission face region crossing with the standard optical axis and a second emission face region extending around the first emission face region, and first and second emission face regions may have a connecting portion such that a point of inflection exists therein.

In addition, the present invention provides a surface light source device comprising the above emission device and a light diffusion member which diffuses and transmits light from the emission device. The present invention also provides a display comprising the surface light source device and a member illuminated by the surface light source device.

In every case mentioned above, the light emitting element may be sealed by a sealing material so that light emitted from the light emitting element impinges on the light flux control member after transmitting through the sealing material. The recess may provide a concave surface which is in contact with an outer surface of the sealing material. Alternatively, a gap may be formed between the concave surface and the outer surface of the sealing material.

Further, the present invention is applied to a light flux control member provided with a recess for accommodating a light emitting element. A light flux control member according to the present invention has a light control emission face for causing light coming from the light emitting element after travelling within the light flux control member to be emitted, wherein the light control emission face is configured so as to satisfy the following Conditions 1 and 2 for at least light which is emitted toward within a half-intensity-angular-range around a maximum-intensity-emission-direction from the light emitting element;

Condition 1: Relation $\theta 5/\theta 1>1$ is satisfied except for light emitted toward within an angular-neighborhood of a standard optical axis of the light flux control member;

Condition 2: Value of $\theta 5/\theta 1$ decreases gradually according to increasing of $\theta 1$;

where $\theta 1$ is an emission angle of any light at being emitted from the light emitting element, and $\theta 5$ is an emission angle of that light of $\theta 1$ at then being emitted from the light control emission face of the light flux control member.

The recess may be a recess for accommodating a light emitting element together with a sealing material that seals the light emitting element.

According to the present invention, the light emitting element outputs a light flux which the light control emission face of the light flux control member causes to be expanded smoothly and effectively to a broad angular range. As a result, a broad range illumination is realized through the light flux control member.

In addition, if a plurality of light emitting elements are arranged, light fluxes from the respective light emitting elements are mixed with each other easily by transmitting through the light flux control member. This brings a less conspicuous emission color unevenness even if the respective emission colors are not even, providing a high quality illumination.

BRIEF DESCRIPTION OF DRAWINGS

FIGS. 9A to 9F illustrate first, second, third, forth, fifth and sixth examples of light diffusion members, respectively, and FIG. 9G is an enlarged partial view of display;

EMBODIMENT

<Outlined Structure of Surface Light Source Device and Display>

Figure 1:
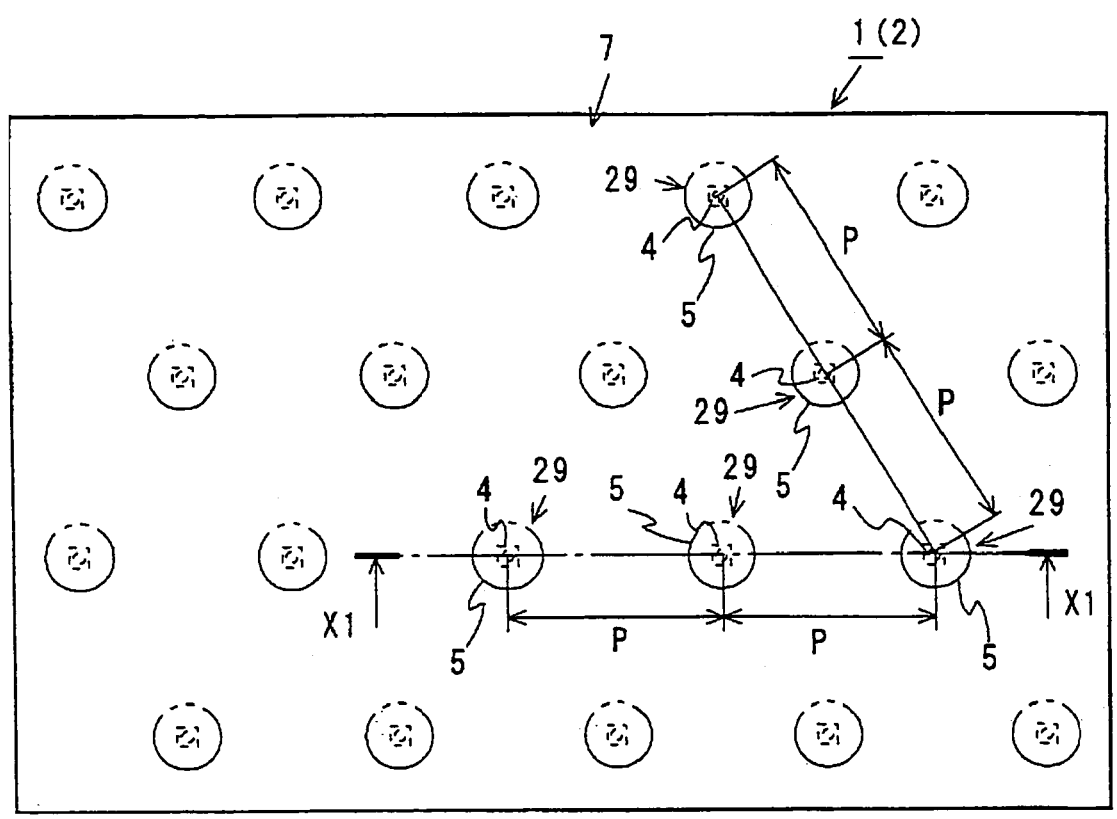
FIG. 1 is a plan view illustrating a surface light source device and display to which the present invention is applicable, with a member to be illuminated and light diffusion member being not shown.
Figure 2:
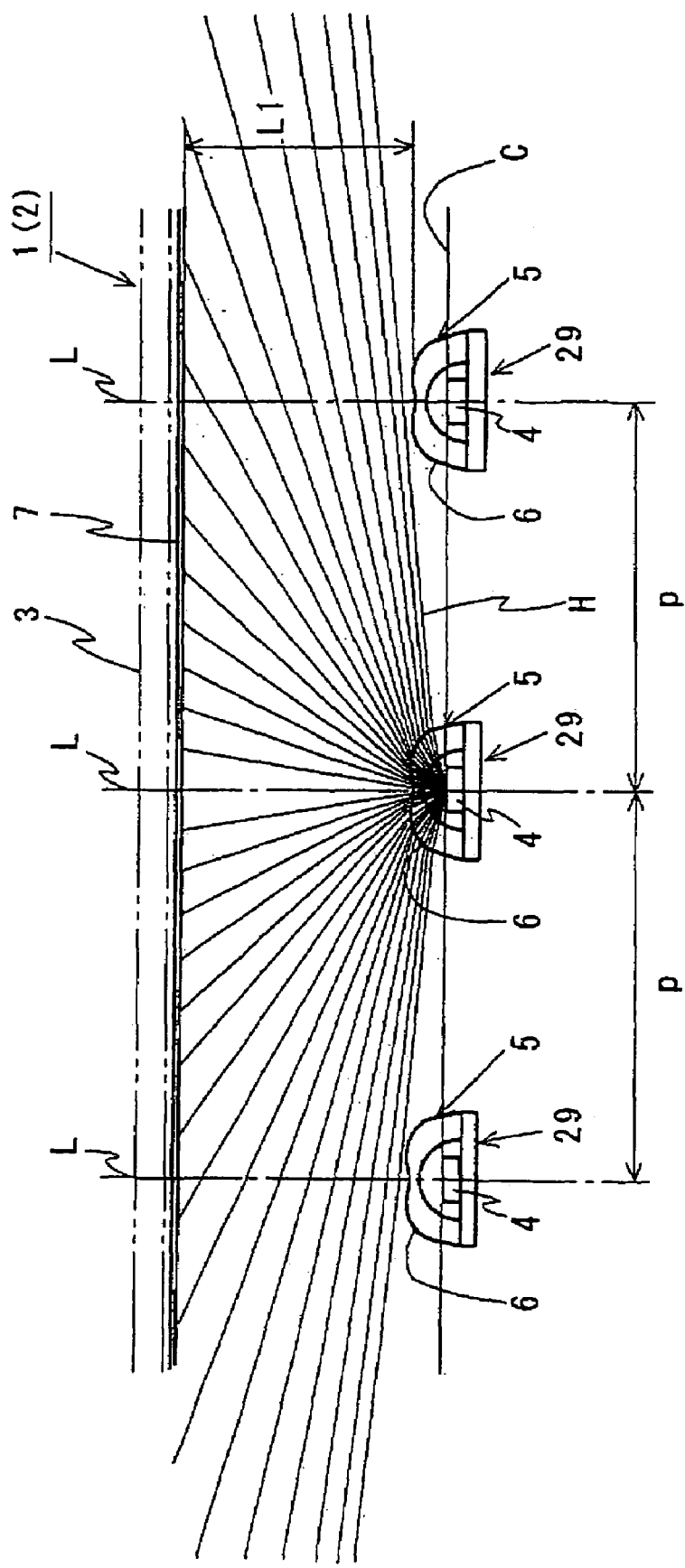
FIG. 2 is a cross section view of the display shown in FIG. 1 along X1-X1.
Figure 3:
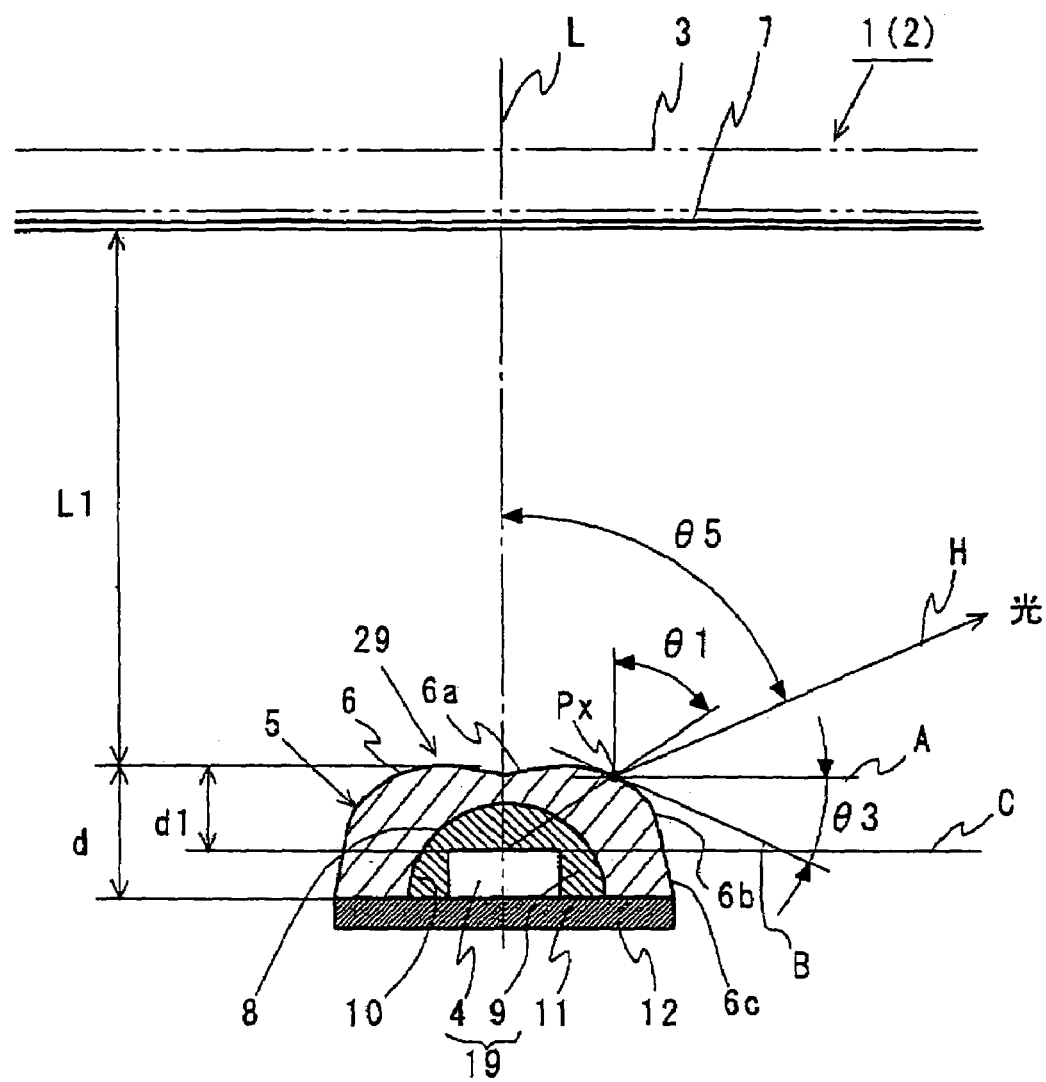
FIG. 3 is a partial cross section view of the display shown in FIG. 1 along a plane on which an optical axis of a LED extends, giving a partial and enlarged illustration of FIG. 2.

FIGS. 1 to 3 show display 1 and surface light source device 2 included in display 1. FIG. 1 is a plan view illustrating surface light source device 2, with a member such as LCD panel 3 to be illuminated being not shown. FIG. 2 is an outlined cross section view of display 1 along X1-X1 in FIG. 1. FIG. 3 is a partial cross section view of display 1 along a plane on which standard optical axis L of light emitting element 4 extends, giving a partial and enlarged illustration of FIG. 2 in order to illustrate a configuration of light control emission face 6 of light flux control member 5.

Standard optical axis L is defined as a light traveling direction at a center of three-dimensional emission flux from an emission device. Please note that this term (i.e. standard optical axis) is used for a light flux control member in the same way in the instant specification. That is, a light traveling direction at a center of three-dimensional emission flux from an light flux control member is called "standard optical axis of light flux control member".

In this embodiment handles a typical case where an optical axis of light emitting element 4 (i.e. a light traveling direction at a center of three-dimensional emission flux from light emitting element 4) accords with standard optical axis L. Accordingly, standard optical axis L is called simply "optical axis L" occasionally.

Referring to FIGS. 1 to 3, display 1 comprises light diffusion member 7 shaped like a rectangle, point-like light emitting elements 4 and member (display panel) 3 to irradiated.

Light emitting elements 4 are disposed at generally regular intervals with pitch P. Light emitting elements 4 may be sealed by sealing material 9 as illustrated, so that light emitting element 4 and sealing material 9 compose LED 19.

Surface light source device 2 is composed of point-like light sources (light emitting elements 4 or LEDs 19), flux control member 5 and light diffusion member 7, in which an emission device is composed of point-like light sources (light emitting elements 4 or LEDs 19) and flux control member 5.

<Light Flux Control Member>

(First Mode)

Light flux control member 5 is made of transparent resin such as PMMA (polymethyl methacrylate), PC (polycarbonate) or EP (epoxy resin), or transparent glass, being shaped as shown in FIGS. 1 to 3 with a circle-like planar shape.

Figure 4A:
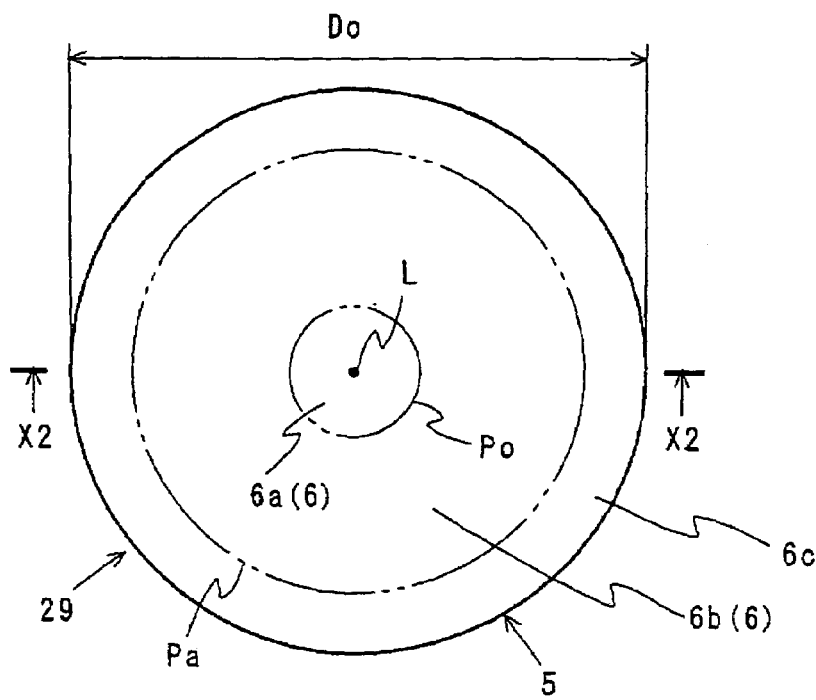
FIGS. 4A, 4B and 4C show first mode of light flux control member in details, FIG. 4a being a plan view, FIG. 4b being a cross section view along X2-X2 in FIG. 4a, and FIG. 4c being an exploded view of the light flux control member and LED.
Figure 4B:
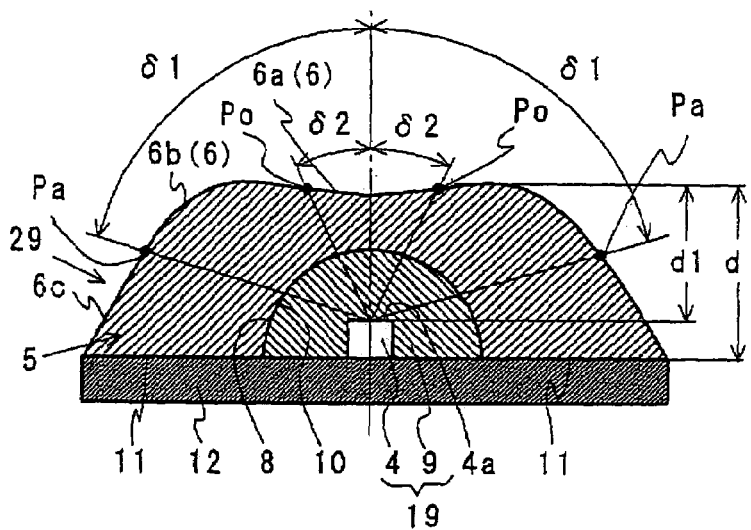
Figure 4C:
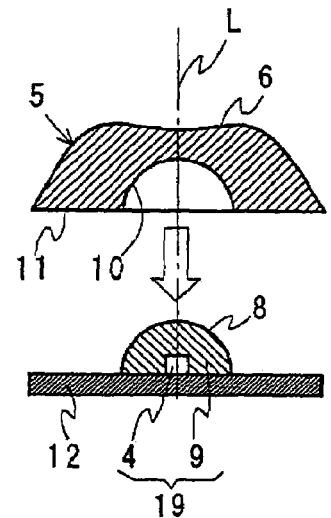

Referring to FIG. 4B, light flux control member 5 has hemisphere-like recess 10 on a back side, namely, on a lower side in FIG. 4B. Recess 10 is in contact with light emitting surface 8 of light emitting element 4, being located at a center of a back side of light flux control member 5 as shown in FIGS. 4B and 4C. Light emitting surface 8 is shaped like a hemisphere, fitting hemisphere-like recess 10.

Light flux control member 5 has a flat portion 11 on the back side. Flat portion 11 is stuck and fixed to mounting substrate 12 of light emitting element 4. Recess 10 is stuck and fixed to light emitting surface 8 of light emitting element 4.

Light flux control member 5 has light control emission face 6 on an outer side. Light control emission face 6 comprises first emission face region 6a and second emission face region 6b extending around first emission face region 6a.

Optical axis L crosses with first emission face region 6a at a crossing point which provides a center of range in which first emission face region 6a extends.

First emission face region 6a has a gently curved downward-convex configuration as shown in FIG. 4B, being shaped like a partially removed sphere providing a concave configuration.

Second emission face region 6b is formed continuously adjacent to first emission face region 6a as shown in FIG. 4B, having a gently curved upward-convex configuration. It can be said that second emission face region 6b is shaped like a ring-band-like-disk extending around first emission face region 6a.

Second emission face region 6b is connected to first emission face region 6a smoothly, providing a connecting portion (boundary portion) in which a point of inflection Po. Third emission face region 6c is formed on an outside of second emission face region 6b as to connecting second emission face region 6b to flat portion 11 on the back side, as shown in FIG. 4B.

FIG. 4B shows a generally straight slope-like cross section of third emission face region 6c. However, this is merely an example. That is, curved configuration may be employed so far as uniform and broad emission from light flux control member 5 is not spoiled.

Here, angles $\delta 1$ and $\delta 2$ are defined as follows.

$\delta 1$; angle of connection point Pa of emission face regions 6b and 6c with respect to optical axis L $\delta 2$; angle of inflection point Po with respect to optical axis L In FIG. 3, reference plane C is defined a horizontal plane perpendicular to optical axis L of light emitting element 4. Line A is defined as a line extends parallel with reference plane C as to pass position Px at which light beam H is emitted from light control emission face 6 after travelling within light flux control member 5. Px is a crossing point of light control emission face 6 and light beam H.

In FIG. 3, line B is a tangent of configuration of light control emission face 6, making angle $\theta 3$ at position Px with respect to line A. Light beam H makes emission angle $\theta 5$ with respect to light control emission face 6 after travelling within light flux control member 5. Emission angle $\theta 5$ is defined as angle of light beam H on emitting from light control emission face 6 with respect to optical axis L.

An angular range called "half-intensity-angular-range" is introduced. In general, light emitting element 4 has the maximum emission intensity direction along optical axis L. The maximum emission intensity direction is also a direction along a normal of reference plane C. Emission intensity of light emitting element 4 falls gradually according to an increasing angular deviation from the maximum emission intensity direction.

Under such situation, "half-intensity-angular-range" is defined as an angular range extending up to an intensity-falling of 50% as compared with the maximum emission intensity from the maximum emission intensity direction.

Configuration of light control emission face 6 shown in FIG. 3 satisfies the following Conditions 1 and 2 for "light which is emitted toward within a certain angular range at least including half-intensity-angular-range from light emitting element 4". It is noted that this certain angular range is exemplarily shown in FIG. 5 as an angular range of $\theta 1 < \delta 1$.

Condition 1: Relation $\theta 5/\theta 1 > 1$ is satisfied except for light emitted toward within an angular-neighborhood of a standard optical axis L of emission device 29.

Condition 2; Value of $\theta 5/\theta 1$ falls gradually according to increasing of $\theta 1$.

Please note that θ1 is an emission angle of any light at being emitted from light emitting element 5, and θ5 is an emission angle of that light of θ1 at then being emitted from light control emission face 6.

It is noted that "angular-neighborhood of a standard optical axis L" (angular-neighborhood of optical axis L in FIG. 3) is preferably an angular range of θ1 within 5° (within ±5° from the direction of optical axis L).

Figure 5:
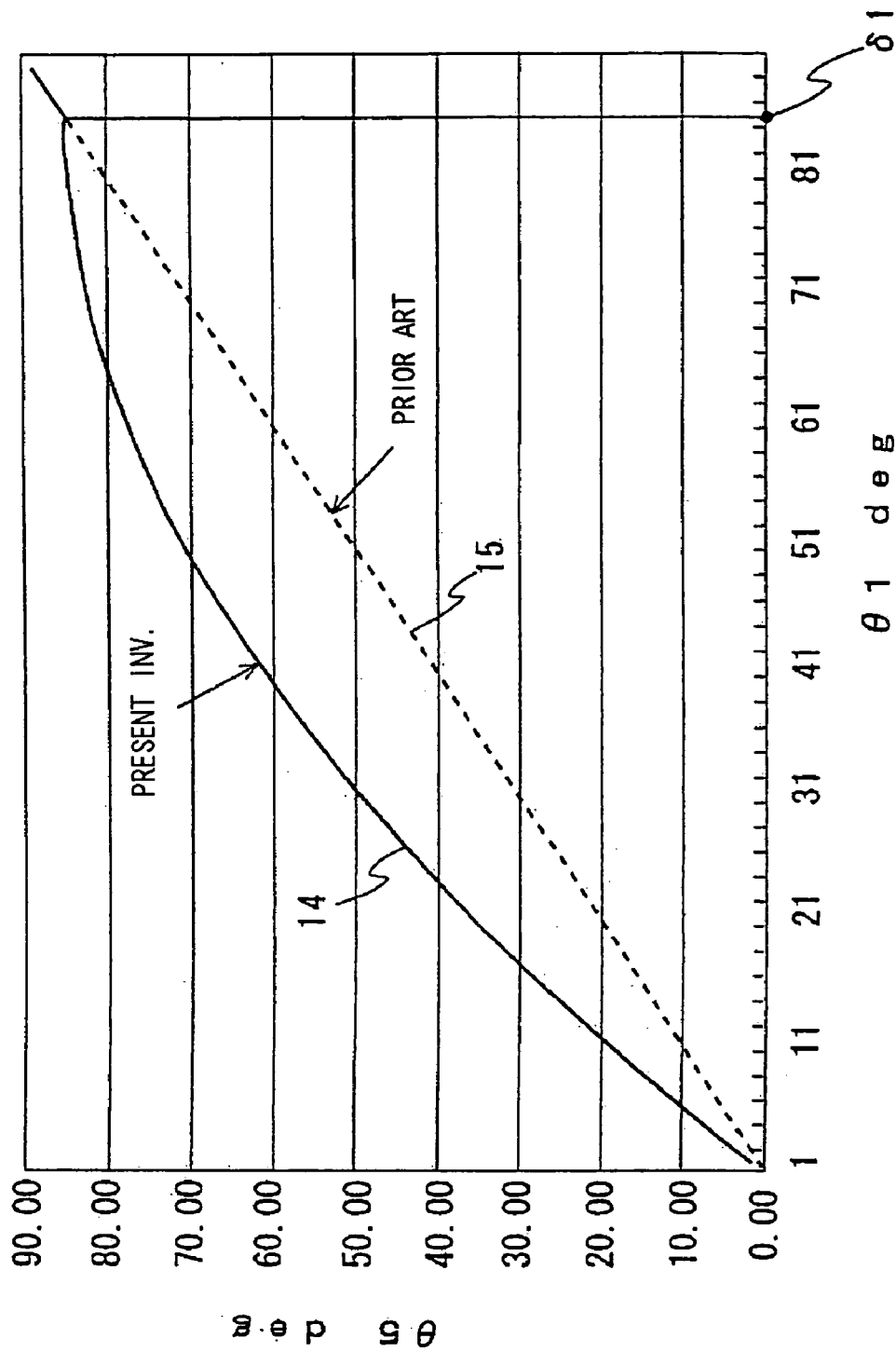
FIG. 5 is a diagram illustrating a relation between LED-emission angle (emission angle of light emitting element emission angle, in general) $\theta 1$ and emission angle $\theta 5$ of a light flux control member (control-member-emission angle)

Referring to FIG. 5, dotted line 15 shows a relation of (θ5/θ1)=1. If degree of light diverging of light flux control member 5 is expressed by coefficient α, θ5 is expressed by Formula 1 under a condition such that θ1<δ1, and θ3 is expressed by Formula 2 as follows.

$$\theta 5=[1+\{(\delta 1-\theta 1)\times \alpha/\delta 1\}]\times \theta 1 \quad \text{Formula 1}$$

, where θ1<δ1.

$$\theta 3=\tan^{-1}\{(\sin \theta 5 - n \cdot \sin \theta 1)/(\cos \theta 5 - n \cdot \cos \theta 1)\} \quad \text{(Formula 2)}$$

, where n is refractive index of light flux control member.

Figure 6:
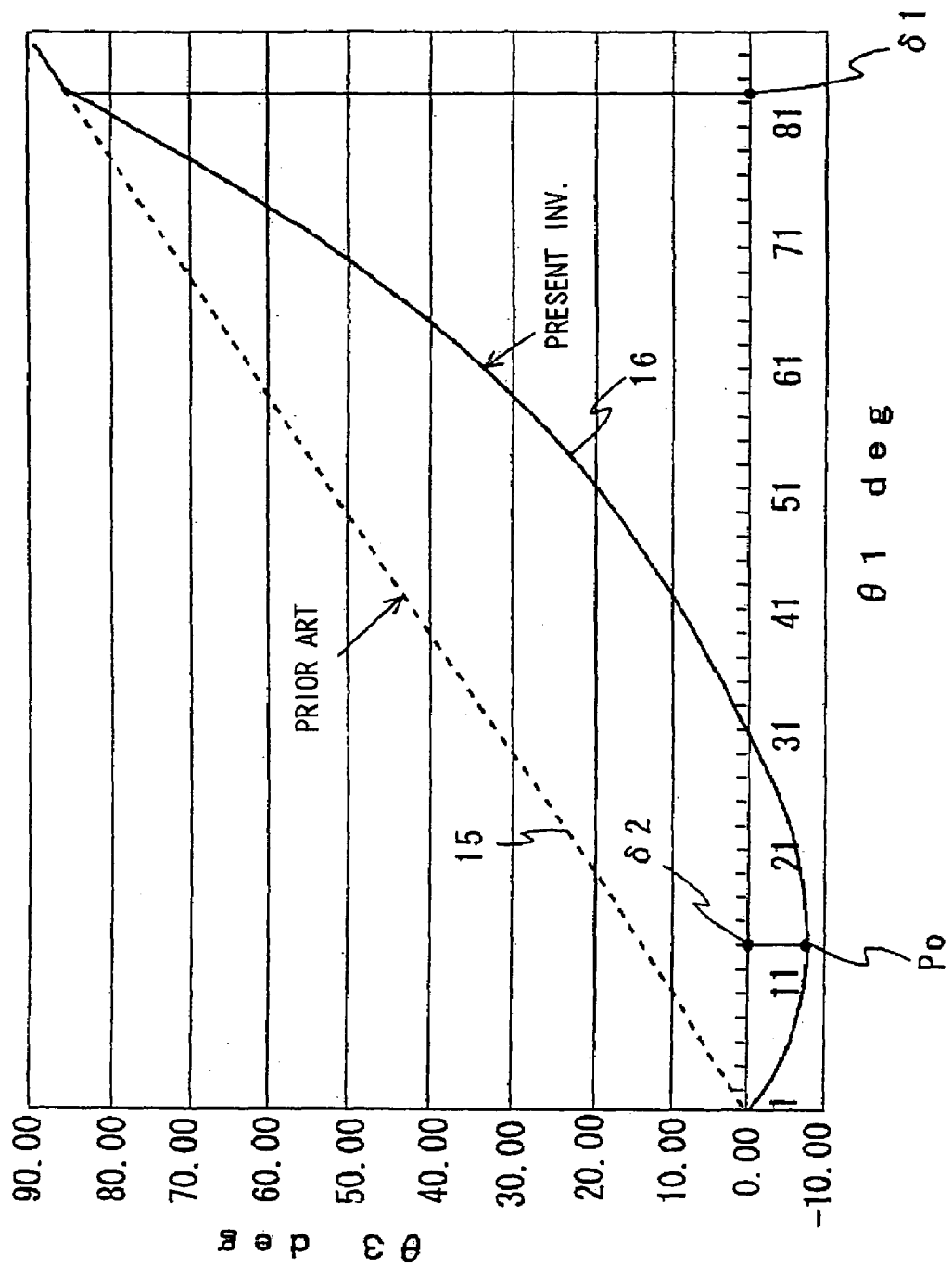
FIG. 6 is a diagram illustrating a relation between LED-emission angle $\theta 1$ and lens-face inclination angle $\theta 3$.

Such calculated angle θ3 decreases gradually according to increasing of θ1 until θ1=δ2 is satisfied from an angular neighbourhood of optical axis L as shown by curve 16 in FIG. 6. In a range of θ1>δ2, θ3 increases gradually according to increasing of θ1. If θ1=δ2, θ3=θ1.

General operations light flux control member 5 having light control emission face 6 are as follows.

As illustrated in FIGS. 2 and 3, light beam H generally representing emission from light emitting element 4 enters into light flux control member 5, then traveling within light flux control member 5 and reaches light control emission face 6 to be emitted toward an ambient medium (air) according to Snell's Law.

This emission from light control emission face 5 in accordance with the present invention occurs more uniformly toward an illumination range, and broader and smoother angular expansion is realized as compared with a case of emission from conventional hemisphere light flux control member 23. In other words, locally strong emission toward just above portion of light emitting element 4.

(Example of First Mode)

In the next place, an example of emission device 29 employing light flux control member 5 of first mode is described by referring to FIGS. 1 to 4. Shapes and others of first and second emission face regions 6a, 6b are designed depending on various factors such as the followings.

(a): Emission characteristics of light emitting element 4, especially, angular extension represented by half-intensity-angular-range.

(b): Thickness d of light flux control member 5 along a direction of optical axis L, especially, distance d1 from emission portion 4a of light emitting element 4 to light control emission face 6 along a direction of optical axis L.

(c): Arrangement pitch p of light emitting element 4.

(d): Outer diameter Do of light flux control member 5.

(e): Distance L1 from light control emission face 6 to light diffusion member 7 along a direction of optical axis L.

(f): Refractive index n of light flux control member 5.

(g): Configuration of incidence concave face (Configuration of concave surface provided by recess 10).

(h): Refractive index n of medium (air or sealing material) through which light of light emitting element 4 transmits before impinging on light flux control member 5.

According to an example, light flux control member 5 has a hemisphere-like recess, being made of transparent resin of refractive index n=1.49, with L1=13.89 mm, p=24.25 mm, d=3.31 mm, d1=2.11 mm and Do=7.85 mm. Medium between light flux control member 5 and light emitting element 4 has the same refractive index as that of light flux control member 5.

This light flux control member 5 has first and second emission face regions 6a, 6b which form a connection portion at which angle θ1 satisfies θ1=δ2=16°. In addition, second and third emission face regions 6b, 6c form a connection portion at which angle θ1 satisfies θ1=δ1=85°. It can be said that third emission face region 6c is provided by rotating tangent of second emission face regions 6b by 360° around optical axis L.

A range of θ1≦δ2 corresponds to first emission face region 6a and range of δ2≦θ1≦δ1 corresponds to second emission face region 6b, and range of δ1≦θ1 corresponds to third emission face region 6c, in FIG. 4B.

It is noted that, if sealing material 9 has refractive index substantially the same as that of light flux control member 5, light beam H from light emitting element 4 reaches light control emission face 6 without undergoing refraction. For instance, if sealing material 9 is made of the same transparent resin or glass, this is realized.

However, the present invention is not limited by this mode. Sealing material 9 may have refractive index different from that of light flux control member 5. It is noted that absence of sealing material 9 air occupies a gap between light emitting element 4 and light flux control member 5.

(Example of Second Mode)

Figure 7A:
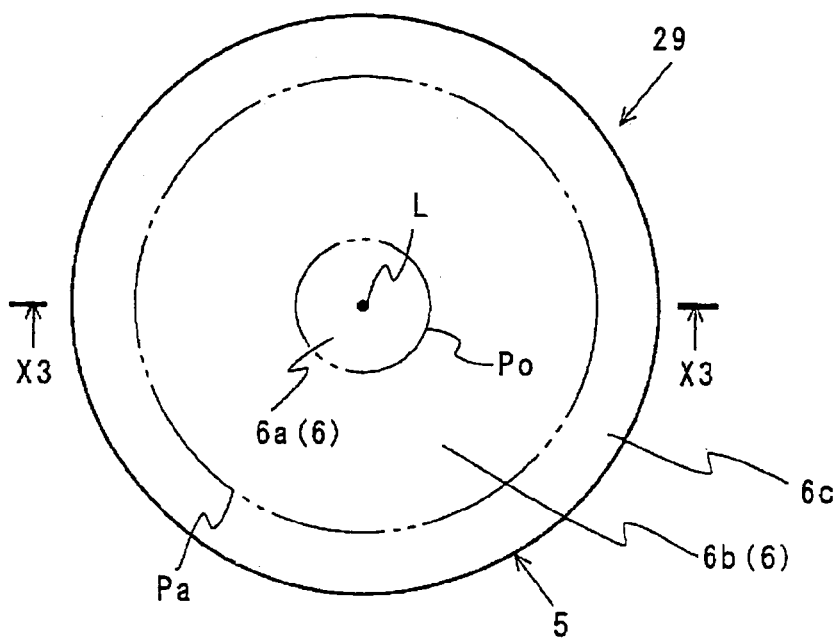
FIGS. 7A, 7B and 7C show a second mode of light flux control member in details, FIG. 7a being a plan view, FIG. 7b being a cross section view along X3-X3 in FIG. 7A, and FIG. 7C being an exploded view of the light flux control member and LED.
Figure 7B:
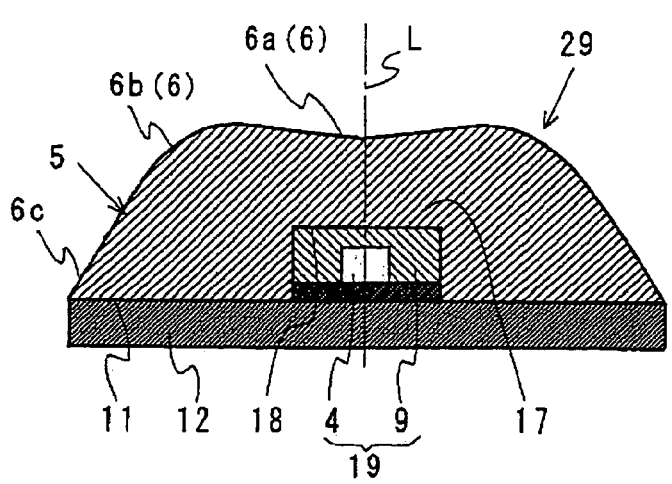
Figure 7C:
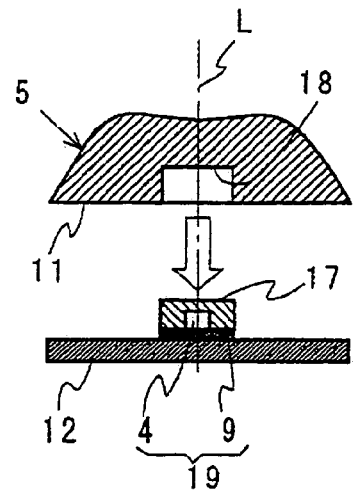

FIG. 7 shows emission device 29 employing light flux control member 5 of second mode in accordance with the present invention. This light flux control member 5 is generally the same as that of first mode except structure for engaging with light emitting element 4.

As shown in FIG. 7, light flux control member 5 is suitable for a case where LED 19 has a rectangular cross section and light emitting face 17. Rectangular recess 18 formed at a center portion on the back side contacts with rectangular light emitting face 17. Light flux control member 5 has flat portion 11 on the back side. Flat portion 11 is stuck and fixed to mounting substrate 12 for light emitting element 4 and recess 18 is stuck and fixed to light emitting surface 17.

Light flux control member 5 of this mode structured as above-described has functions generally the same as those of light flux control member 5 of first mode.

It is noted that, although FIG. 7 shows that sealing material 9 sealing light emitting element 4 (LED 19) has a rectangular cross section, this does not limit the scope of the present invention. For instance, LED 19 may shaped like hemisphere or others.

(Example of Third Mode)

Figure 8:
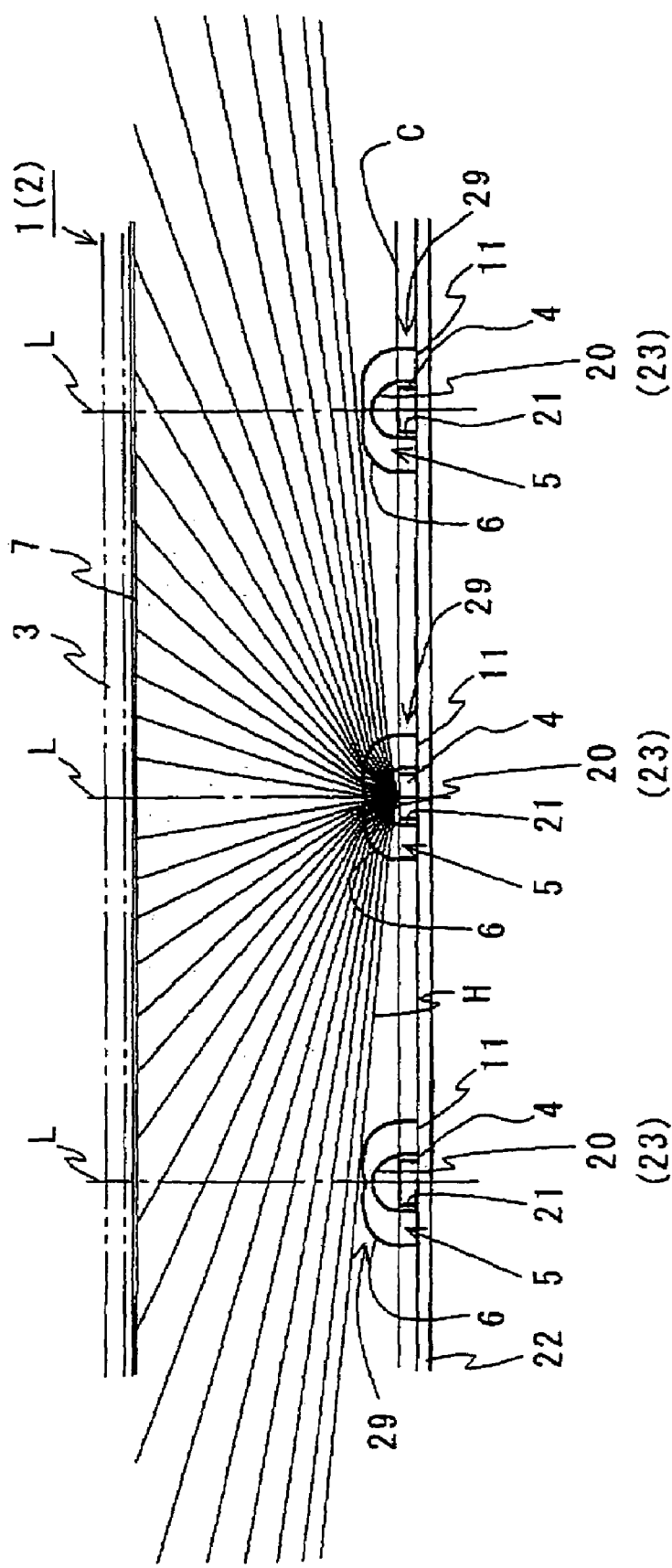
FIG. 8 shows a cross section view of a display employing a light flux control member of a third mode, in an illustration manner the same as that of FIG. 2.

FIG. 8 shows light flux control member 5 of third mode in accordance with the present invention. This light flux control member 5 is generally the same as that of first mode except structure for engaging with light emitting element 4.

As shown in FIG. 8, light flux control member 5 of third mode has a hemisphere-like incidence surface (concave surface of recess 23) 20 engaging with light emitting element 4 with a gap. Incidence surface 20 is formed on the upper side with respect to reference line C in FIG. 8.

Hemisphere-like incidence surface 20 has cylinder-like LED-accommodation-portion 21 engaging with light emitting element 4 with a gap on the lower side in FIG. 8.

Light emitting element 4 is stuck and fixed to substrate 22. On the other hand, light flux control member 5 has flat portion 11 on the lower side and flat portion 11 is stuck and fixed to 22 after light emitting element 4 is accommodated in LED-accommodation-portion 21 and positioned at a predetermined location by an action like applying capping to light emitting element 4.

Light flux control member 5 structured as above-described causes light of light emitting element 4 to enter into light flux control member 5 through hemisphere-like incidence surface 20 after transmitting through an air layer. After propagating in light flux control member 5, emission from light control emission face 6 occurs.

In this mode, light control is performed under consideration of conditions such as difference of the air layer and light flux control member 5, and the concave configuration of incidence face.

Light flux control member 5 of this mode has functions generally the same as those of light flux control member 5 of first mode.

It is noted that the above-described second and third modes may be modified by using only light emitting element 4 instead of LED 19.

Emission device 29 employing light flux control member 5 of first or second mode may be modified as to omit sealing material 9.

Alternatively, sealing material 9 may be used as light flux control member 5. Sealing material 9 may be stuck and fixed to light flux control member 5 or contacted with light flux control member 5 without sticking and fixing.

(Other Modes)

Other modifications such as followings are allowed.

(1): Matting may be applied to light control emission face 6 of light flux control member 5 of the above-described first, second or third mode so that light is diffused on emitting from light control emission face 6.

(2): Light flux control member 5 of the above-described first or second mode may be made of material containing light diffusible articles such as silicone articles or titanium oxide articles.

<Light Diffusion Member>

FIGS. 9a to 9f are side views of light diffusion members 7 in accordance with to first to sixth examples, respectively.

Each light diffusion member 7 is a sheet-like or plate-like member made of light well-permeable resin such as PMMA (polymethyl methacrylate) or PC (polycarbonate), having an area size generally equal to that of member 3 to be illuminated such as LCD panel, advertising display panel.

Light diffusion member 6 shown in FIG. 9A employs sheet-like base material 7a to both faces of which processing for giving light diffusion ability, such as emboss-processing or bead-processing, is applied. Thus both faces of light diffusion member 7 are provided with fine uneven configurations 7b.

Light diffusion member 7 shown in FIG. 9B employs sheet-like base material 7a to both faces of which processing for giving light diffusion ability, such as emboss-processing or bead-processing, is applied. Thus both faces of light diffusion member 7 are provided with fine uneven configurations 7b. In addition, light diffusive material 7c is dispersed within base material 7a.

Light diffusion member 7 shown in FIG. 9C employs sheet-like base material 7a to only an inner face of which processing for giving light diffusion ability, such as emboss-processing or bead-processing, is applied to form a fine uneven configuration 7b. It is noted that the inner face of light diffusion member 7 is a face directed to light flux control member 4. In addition, other face of light diffusion member 7 is provided with a great number of repeated prismatic projections 7d extending along a direction perpendicular to the paper surface.

Light diffusion member 7 shown in FIG. 9D is the same as one shown in FIG. 9C except that light diffusive material 7c is dispersed within base material 7a.

In the same manner as the case of FIG. 9C, processing such as emboss-processing or bead-processing is applied to one face directed to light flux control member 4 to form a fine uneven configuration 7b. The other face of light diffusion member 7 is provided with a great number of repeated prismatic projections 7d extending along a direction perpendicular to the paper surface. Each of prismatic projections 7d shown in FIGS. 9C and 9D is shaped like triangle, for instance, like isosceles triangle.

Light diffusion member 7 shown in FIG. 9E employs sheet-like base material 7a on an emission side face of which circular-cone-like projections 7e for are formed to cause light transmitted through base material 7a to be diffused.

Light diffusion member 7 shown in FIG. 9F employs sheet-like base material 7a on an emission side face of which pyramid-like (such as triangle-pyramid-like, quadrangle-pyramid-like or hexangle-pyramid-like) projections 7f for are formed to cause light transmitted through base material 7a to be diffused.

Every light diffusion member 7 as above transmits and diffuses light emitted from light control emission face 6 of light flux control member 5, causing member 3 to be illuminated uniformly.

It is noted that every light diffusion member 7 as above may be mounted on an inner face directed to light flux control member 5 of member 3 to be illuminated, or alternatively, may be interposed between light flux control member 5 and member 3 to be illuminated, with being separated from member 3.

<Emission Intensity from Light Diffusion Member>

Figure 10:
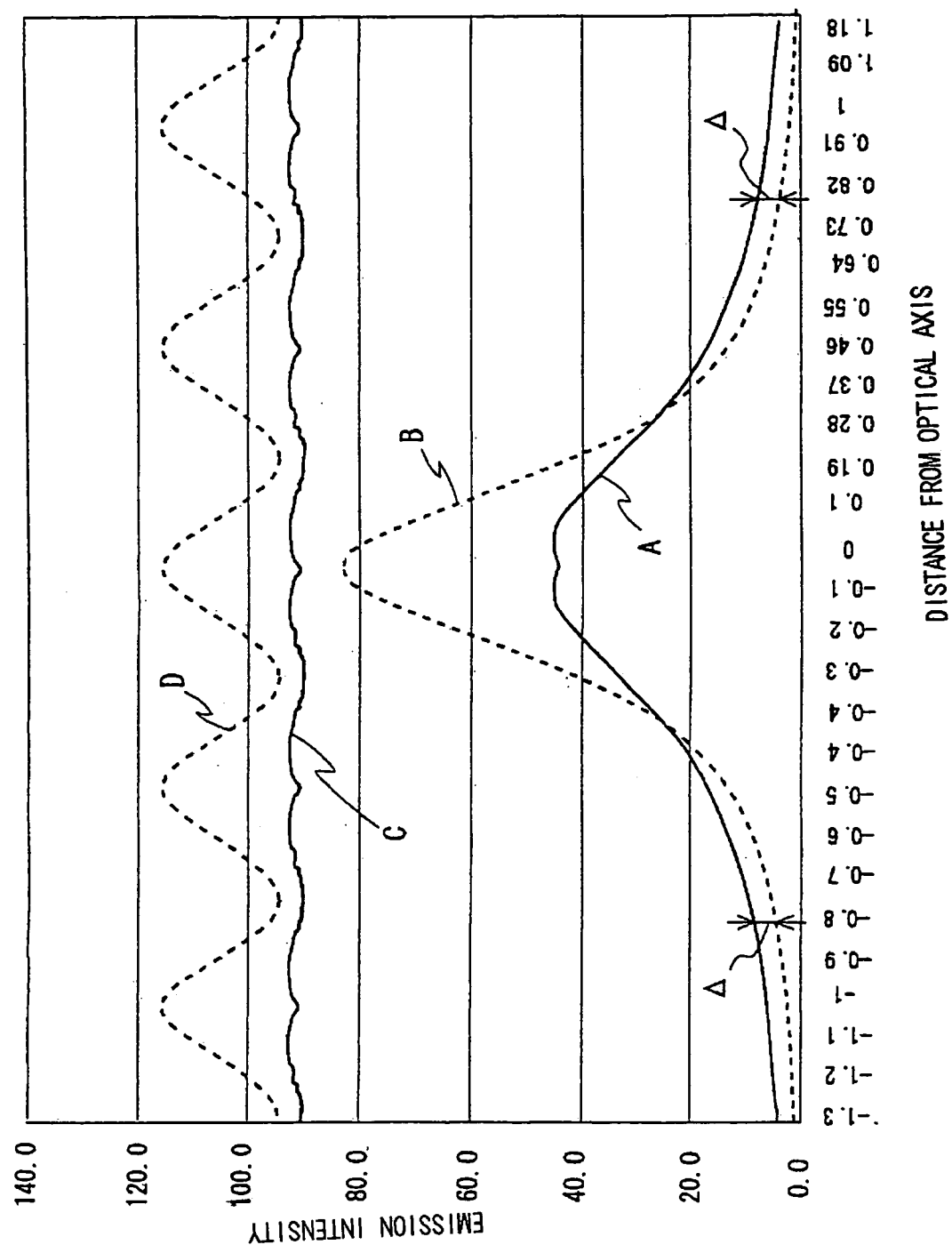
FIG. 10 is a diagram illustrating distributions of emission intensity from a light diffusion member display to which the present invention is applied, together with an emission intensity distribution of an example for comparison (Prior Art 4)

FIG. 10 is a diagram illustrating distributions of emission intensity from light diffusion member 7, together with an emission intensity distribution of an example for comparison (Prior Art 4).

(Case of Single LED Arrangement)

In FIG. 10, curve A shows a distribution of emission intensity in a case where light flux control member 5 in accordance with the present invention is disposed, giving light intensity of one light emitting element 4 after transmitting through light flux control member 5 and light diffusion member 7. Curve B shows a distribution of emission intensity in the prior art case of FIG. 15 where light flux control member 123 is disposed, giving light intensity of one LED 124 after transmitting through light flux control member 123 and light diffusion member 126.

Comparing curve A (using light flux control member 5) with curve B (using light flux control member 123), the followings are understood.

That is, Curve A shows a gently rising mountain-like changing while Curve B shows a sharp rising in the vicinity of optical axis L. Curve A gives smaller intensities in the vicinity of optical axis L as compared with Curve B, but giving grater intensities in positions far from optical axis L as compared with Curve B.

This tells that light flux control member 5 in accordance with the present invention provides more uniformly distributed illumination as compared with the prior art.

(Case of Multi-LED Arrangement)

In FIG. 10, curve C shows a distribution of emission intensity in a case where light flux control members 5 in accordance with the present invention are disposed corresponding to a plurality of light emitting elements 4, giving light intensity of light emitting elements 4 after transmitting through light flux control members 5 and light diffusion member 7 (See FIGS. 1 and 2).

Figure 15:
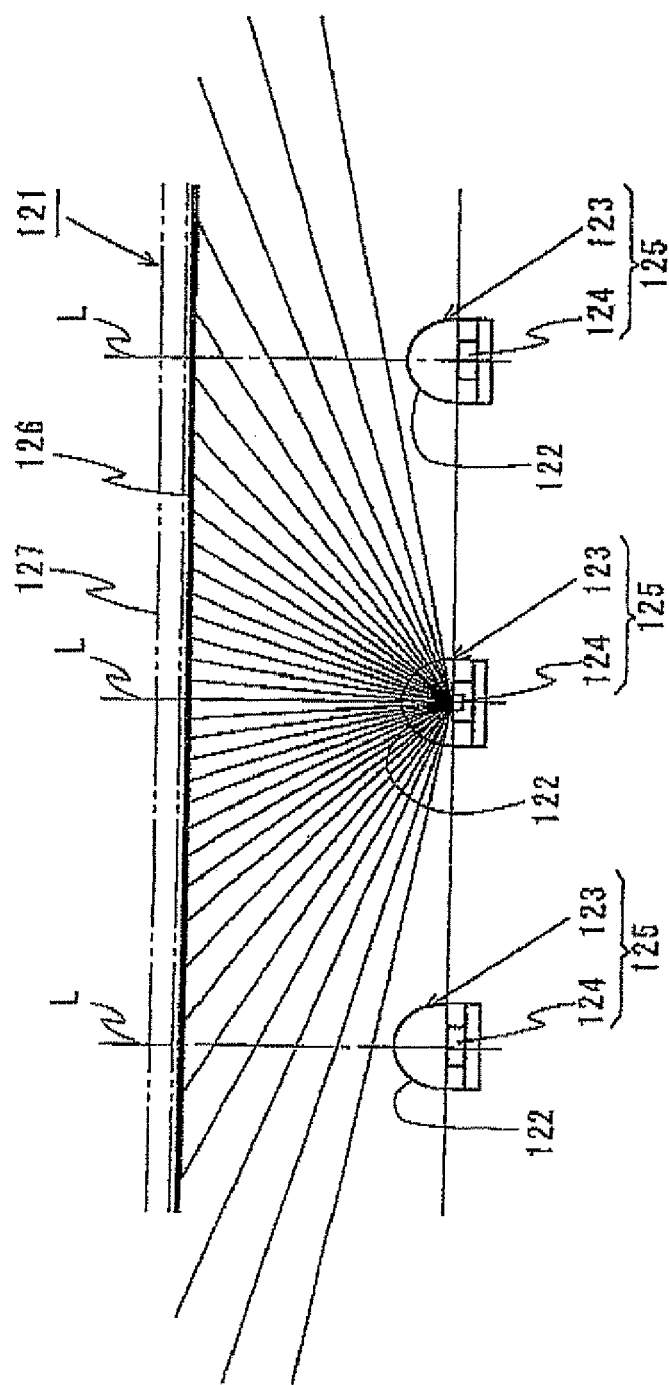
FIG. 15 is a diagram illustrating a cross section of a display in accordance with Prior Art 4.

In FIG. 10, Curve D shows a distribution of emission intensity in the prior art case of FIG. 15 where light flux control members 123 corresponding to a plurality of LEDs 124 are disposed, giving light intensity of one LEDs 124 after transmitting through light flux control members 123 and light diffusion member 126.

Comparing curve C (using light flux control members 5) with curve D (using light flux control members 123), the followings are understood.

That is, Curve D shows a striking wave/-like repeating brightness unevenness corresponding to discretely arranged LEDs 124. To the contrary, Curve C hardly shows such a striking brightness unevenness.

This is supposed to be brought by two facts. One fact is that light from each light emitting element 4 is free from locally strong emission toward a direction along optical axis L and spread widely, as Curve A shows. Another fact is that light beams from light emitting elements 4 adjacent to each other are mixed mutually well, with the result a small bright unevenness is realized on an emission face side of light diffusion ] member 7.

As described above, the present invention can provide uniform and well-mixed illumination as shown in FIG. 10.

Well-mixed illumination enables high quality illumination to be realized even if a plurality of light emitting elements 4, such as white light emitting LEDs), have different intensities or emission tones. For example, even if some emit remarkably yellowish light and others emit slightly yellowish light, uniformly yellowish illumination is obtained.

<Surface Light Source Device and Display for Color Illuminations>

Figure 11A:
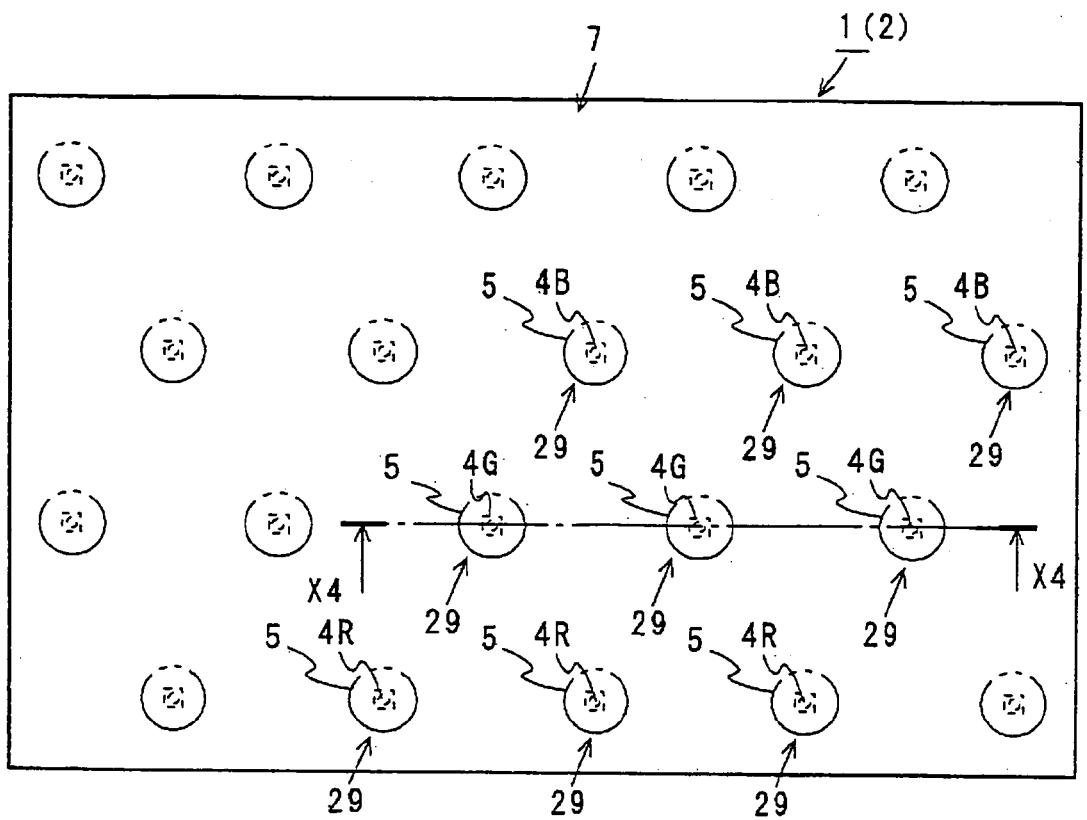
FIGS. 11A and 11B illustrate a color-emission type surface light source device and display using the same to which the present invention is applicable, FIG. 11A being a plan view, with a member to be illuminated and light diffusion member being not shown and FIG. 11B being a cross section view along X4-X4 in FIG. 11A.
Figure 11B:
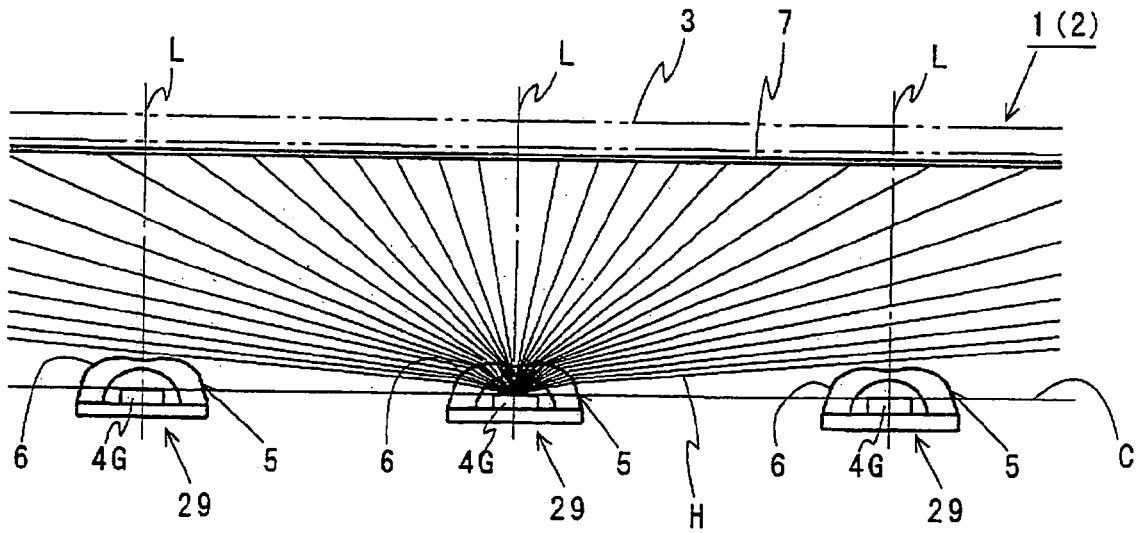
Figure 12:
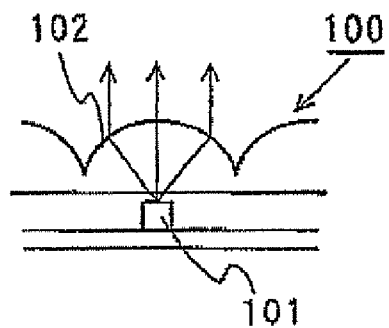
FIG. 12 is a diagram illustrating an outlined structure of Prior Art 1.
Figure 13:
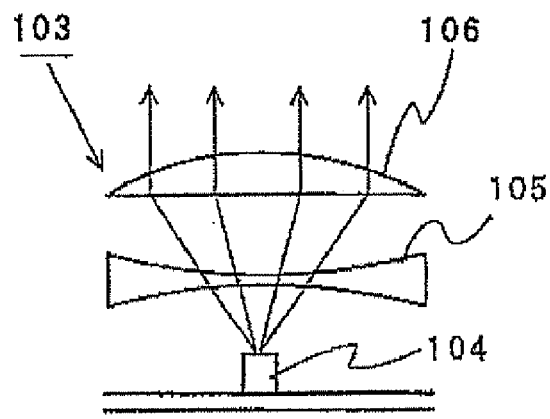
FIG. 13 is a diagram illustrating an outlined structure of Prior Art 2.
Figure 14:
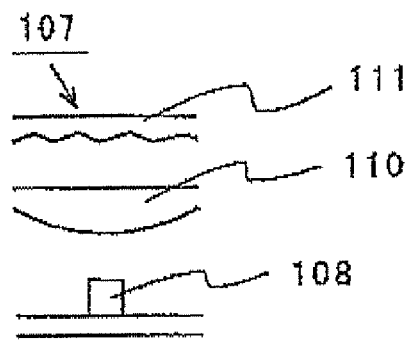
FIG. 14 is a diagram illustrating an outlined structure of Prior Art 3.

FIGS. 11A and 11B illustrate color-emission type surface light source device 2 and display 1 using the same to which the present invention is applicable. FIG. 11A is a plan view, with a member to be illuminated and light diffusion member being not shown and FIG. 11B is a cross section view along X4-X4 in FIG. 11A.

As illustrated, light emitting elements 4R, 4G and 4B emitting light of colors R, G and B are disposed alternately. Light from these light emitting elements is emitted from light control emission face 6 of light flux control member 5 to irradiate member 3 to be irradiated after transmitting through light diffusion member 7.

Not only in a case all light emitting elements 4R, 4G and 4B are lighted on, but also in a case any of light emitting elements 4R, ones 4G and 4B are lighted on, light of each light emitting element can reach far positions over adjacent ones, being mixed well there. This brings a uniform brightness.

It is noted that emission device 29 in accordance with the present invention has third emission face region 6c at which two or more emission devices 29 are connected with each other. If pitch of LED 19 or light emitting element 4 is small, this makes assembling for obtaining surface light source device 2 easy.

If large emission device 29 is produced, one light flux control member may be assembled from a plurality of blocks each of which corresponds to one light emitting element 4.

Further, although above description handles cases optical axis L of light from light emitting element 4 accord a normal direction as shown in FIG. 3, this does not limit the scope of the present invention, For example, the present invention can be applied to cases where optical axis L of light from light emitting element 4 is slightly different from a normal direction due to unevenness in quality of light emitting element 4 or assembling errors of components including light emitting element 4, allowing to provide generally the same functions as those of embodiments described above.

What is claimed is:

1. An emission device comprising a light flux control member provided with a recess and an light control emission face, and a light emitting element accommodated in said recess, said light emitting element emits light which is emitted from said light control emission face after travelling within said light flux control member,
   wherein said light control emission face is configured so as to satisfy the following Conditions 1 and 2 for at least light which is emitted toward within a half-intensity-angular-range around a maximum-intensity-emission-direction from said light emitting element;
   Condition 1: Relation $\theta 5/\theta 1 > 1$ is satisfied except for light emitted toward within an angular-neighborhood of a standard optical axis of said emission device;
   Condition 2: Value of $\theta 5/\theta 1$ decreases gradually according to increasing of $\theta 1$;
   where $\theta 1$ is an emission angle of any light at being emitted from said light emitting element, and $\theta 5$ is an emission angle of that light of $\theta 1$ at then being emitted from said light control emission face of said light flux control member.

2. The emission device in accordance with claim 1, wherein said recess provides a concave surface which is in contact with an light emitting surface of said light emitting element.

3. The emission device in accordance with claim 1, wherein said recess provides a concave surface and a gap is formed between said concave surface and an light emitting surface of said light emitting element.

4. The emission device in accordance with claim 1, 2 or 3, wherein said light control emission face includes a first emission face region crossing with said standard optical axis and a second emission face region extending around said first emission face region, said first and second emission face regions having a connecting portion in which a point of inflection exists.

5. A surface light source device comprising an emission device and a light diffusion member which diffuses and transmits light from said emission device,
   wherein said emission device is an emission device in accordance with claim 1, 2 or 3.

6. A surface light source device comprising an emission device and a light diffusion member which diffuses and transmits light from said emission device,
   wherein said emission device is an emission device in accordance with claim 4.

7. The surface light source device comprising an emission device and a light diffusion member which diffuses and transmits light from said emission device,
   wherein said emission device is an emission device in accordance with claim 5.

8. The surface light source device comprising an emission device and a light diffusion member which diffuses and transmits light from said emission device,
   wherein said emission device is an emission device in accordance with claim 6.

9. The emission device in accordance with claim 1, wherein said light emitting element is sealed by a sealing material so that light emitted from said light emitting element impinges on said light flux control member after transmitting through said sealing material.

10. The emission device in accordance with claim 9, wherein said recess provides a concave surface which is in contact with an outer surface of said sealing material.

11. The emission device in accordance with claim 9, wherein said recess provides a concave surface and a gap is formed between said concave surface and an outer surface of said sealing material.

12. The emission device in accordance with claim 9, 10 or 11, wherein said light control emission face includes a first emission face region crossing with said standard optical axis and a second emission face region extending around said first emission face region, said first and second emission face regions having a connecting portion in which a point of inflection exists.

13. The surface light source device comprising an emission device and a light diffusion member which diffuses and transmits light from said emission device,
    wherein said emission device is an emission device in accordance with claim 9, 10 or 11.

14. The surface light source device comprising an emission device and a light diffusion member which diffuses and transmits light from said emission device,
    wherein said emission device is an emission device in accordance with claim 12.

15. The surface light source device comprising an emission device and a light diffusion member which diffuses and transmits light from said emission device,
    wherein said emission device is an emission device in accordance with claim 13.

16. The surface light source device comprising an emission device and a light diffusion member which diffuses and transmits light from said emission device,
    wherein said emission device is an emission device in accordance with claim 14.

17. A light flux control member provided with a recess for accommodating a light emitting element, comprising:
    a light control emission face for causing light coming from said light emitting element after travelling within said light flux control member to be emitted,
    wherein said light control emission face is configured so as to satisfy the following Conditions 1 and 2 for at least light which is emitted toward within a half-intensity-angular-range around a maximum-intensity-emission-direction from said light emitting element;
    Condition 1: Relation $\theta 5/\theta 1 > 1$ is satisfied except for light emitted toward within an angular-neighborhood of a standard optical axis of said light flux control member;
    Condition 2: Value of $\theta 5/\theta 1$ decreases gradually according to increasing of $\theta 1$;
where $\theta 1$ is an emission angle of any light at being emitted from said light emitting element, and $\theta 5$ is an emission angle of that light of $\theta 1$ at then being emitted from said light control emission face of said light flux control member.

18. The light flux control member in accordance with claim 17, wherein said recess is a recess for accommodating a light emitting element together with a sealing material that seals said light emitting element.

* * * * *